(12) United States Patent
Yang et al.

(10) Patent No.: US 7,944,029 B2
(45) Date of Patent: May 17, 2011

(54) NON-VOLATILE MEMORY WITH REDUCED MOBILE ION DIFFUSION

(75) Inventors: Xiaoyu Yang, Campbell, CA (US); Qing Li, San Jose, CA (US); Albert Meeks, Sunnyvale, CA (US); Kim Le, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 22 days.

(21) Appl. No.: 12/560,727

(22) Filed: Sep. 16, 2009

(65) Prior Publication Data

US 2011/0062563 A1    Mar. 17, 2011

(51) Int. Cl.
*H01L 23/48* (2006.01)

(52) U.S. Cl. .............. 257/666; 257/701; 257/E23.021; 438/106; 438/123

(58) Field of Classification Search .......... 257/666, 257/686, 701, 748, E23.172, E23.021; 438/106, 438/123, 125, 627, 643, 653
See application file for complete search history.

(56) References Cited

U.S. PATENT DOCUMENTS

| | | | |
|---|---|---|---|
| 4,804,615 A | 2/1989 | Larson | |
| 4,806,200 A | 2/1989 | Larson | |
| 5,147,692 A | 9/1992 | Bengston | |
| 5,153,385 A | 10/1992 | Juskey | |
| 5,492,586 A | 2/1996 | Gorczyca | |
| 5,990,545 A | 11/1999 | Schueller | |
| 6,041,495 A | 3/2000 | Yoon | |
| 6,084,311 A | 7/2000 | Jiang et al. | |
| 6,388,205 B1 | 5/2002 | Chua | |
| 6,424,099 B1 | 7/2002 | Kirkpatrick | |
| 6,682,872 B2 | 1/2004 | Sachdev | |
| 6,809,935 B1 | 10/2004 | Lee | |
| 6,939,576 B2 | 9/2005 | Deshpande | |
| 7,132,357 B2 | 11/2006 | Underwood | |
| 7,259,028 B2 | 8/2007 | Takiar | |
| 7,443,693 B2 | 10/2008 | Arnold | |
| 2001/0033478 A1 | 10/2001 | Ortiz | |
| 2002/0011656 A1 | 1/2002 | Swanson | |
| 2002/0166681 A1 | 11/2002 | Mazurkiewicz | |
| 2004/0007386 A1 | 1/2004 | Tsou | |
| 2004/0251557 A1 | 12/2004 | Kee | |
| 2005/0082672 A1 | 4/2005 | Hsu et al. | |
| 2007/0238361 A1 | 10/2007 | Fudo | |
| 2008/0001303 A1 | 1/2008 | Yu | |
| 2008/0142996 A1 | 6/2008 | Subramanian | |
| 2008/0305306 A1 | 12/2008 | Yu et al. | |

OTHER PUBLICATIONS

Konform AR, ITW Chemtronics, www.chemtronics.com, printed on Jul. 29, 2009.

(Continued)

*Primary Examiner* — Roy K Potter
(74) *Attorney, Agent, or Firm* — Vierra Magen Marcus & DeNiro LLP

(57) ABSTRACT

Mobile ion diffusion causes a shift in the threshold voltage of non-volatile storage elements in a memory chip, such as during an assembly process of the memory chip. To reduce or avoid such shifts, a coating can be applied to a printed circuit board substrate or a leader frame to which the memory chip is surface mounted. An acrylic resin coating having a thickness of about 10 μm may be used. A memory chip is attached to the coating using an adhesive film. Stacked chips may be used as well. Another approach provides metal barrier traces over copper traces of the printed circuit board, within a solder mask layer. The metal barrier traces are fabricated in the same pattern as the copper traces but are wider so that they at least partially envelop and surround the copper traces. Corresponding apparatuses and fabrication processes are provided.

22 Claims, 11 Drawing Sheets

OTHER PUBLICATIONS

Konform AR, Chemtronics Technical Data Sheet, TDS #CTAR, MSDS #0708, printed on Jul. 29, 2009.

Konform, SF, Chemtronics Technical Data Sheet, TDS #CTSR, Jun. 2006.

J.H. Das, et al., "Metal Diffusion in Polymers," IEEE Transactions on Components, Packaging, and Manufacturing Technology—Part B, vol. 17, No. 4, pp. 620-625, Nov. 1994.

International Search Report & The Written Opinion of the International Searching Authority, Patent Cooperation Treaty, International Application No. PCT/US2010/047953 filed Sep. 7, 2010.

Block location in chip

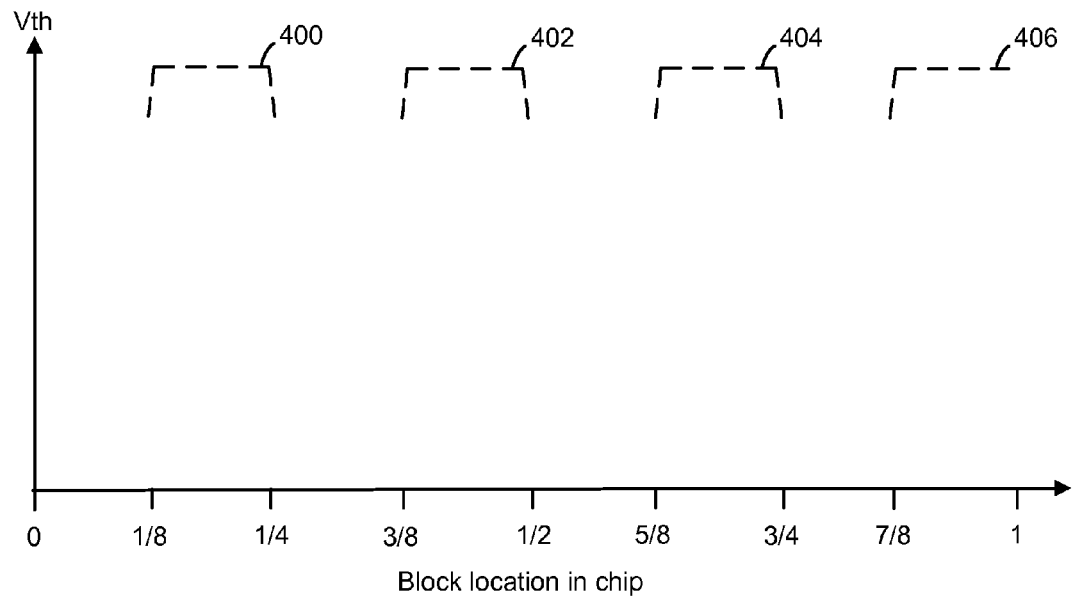
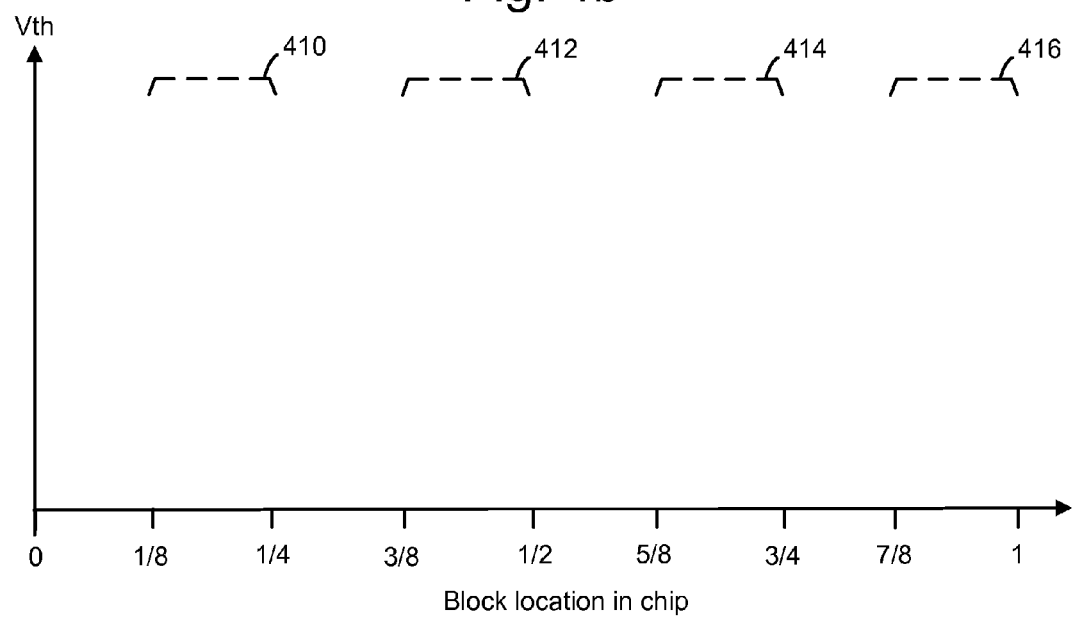

NON-VOLATILE MEMORY WITH REDUCED MOBILE ION DIFFUSION

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Typically, a program voltage Vpgm applied to the control gate during a program operation is applied as a series of pulses that increase in magnitude over time. The program voltage can be applied to a selected word line. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

However, one issue which continues to be problematic is data retention. The threshold voltages of storage elements which are programmed to respective target data states can subsequently change for various reasons. As a result, the data which is stored can become corrupted so that it cannot be accurately read back.

BRIEF DESCRIPTION OF THE DRAWINGS

FIG. 4a depicts a relationship of threshold voltage versus block location for the arrangement of FIG. 3, where there are significant variations in threshold voltage for the programmed blocks.

FIG. 4b depicts a relationship of threshold voltage versus block location for the arrangement of FIG. 3, where variations in threshold voltage of the programmed blocks are reduced.

DETAILED DESCRIPTION

A non-volatile memory apparatus and a method of fabrication thereof are provided in which mobile ion diffusion is reduced through use of a coating or patterned barrier material.

Data retention in a non-volatile storage device is impacted by various factors which cause shifts in threshold voltage distributions, particularly for higher programmed states. Mobile ions are believed to cause threshold voltage shifts for certain data patterns. Mobile ions can be introduced during an assembly process in which a memory chip is attached to a substrate such as a printed circuit board (PCB) substrate or a leader frame. Materials in the substrate underneath the solder mask, such as the copper trace, may introduce such ions. Shifts in threshold voltage distributions can be reduced by applying a coating to the top of the substrate or leader frame before attaching the memory chip. An acrylic resin coating has been found to be effective. Another possible technique is to form barrier traces in a solder mask layer from a conductive material which surrounds the conductive copper traces of the PCB circuitry.

The techniques provided herein are suitable for use with non-volatile memory such as NAND flash memory, which connects multiple transistors in series between two select gates, in a NAND string. The techniques are expected to be effective with other types of non-volatile memory devices as well as other type of semiconductor devices.

Figure 1:
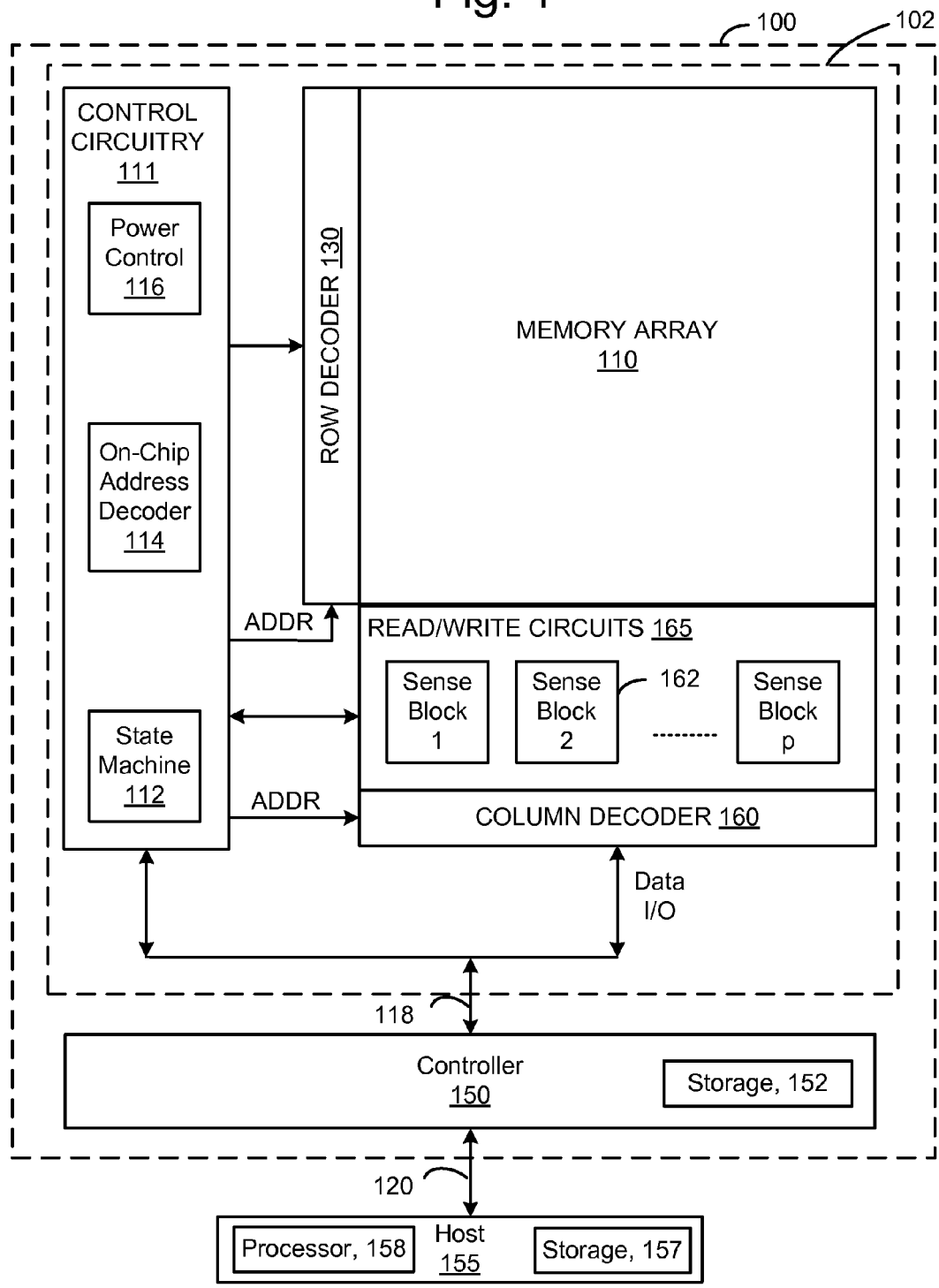
FIG. 1 is a block diagram of a non-volatile memory system using single row/column decoders and read/write circuits.

FIG. 1 is a block diagram of a non-volatile memory system using single row/column decoders and read/write circuits. The diagram illustrates a memory device 100 having read/write circuits for reading and programming a page of storage elements in parallel, according to one embodiment. Memory device 100 may include one or more memory die 102. Memory die 102 includes a two-dimensional array of storage elements 110, control circuitry 110, and read/write circuits 165. In some embodiments, the array of storage elements can be three dimensional. The memory array 110 is addressable by word lines via a row decoder 130 and by bit lines via a column decoder 160. The read/write circuits 165 include multiple sense blocks 162 and allow a page of storage elements to be read or programmed in parallel. Typically a controller 150 is included in the same memory device 100 (e.g., a removable storage card) as the one or more memory die 102. Commands and Data are transferred between the host 155 and controller 150 via lines 120 and between the controller and the one or more memory die 102 via lines 118.

The host 155 can be a controller of an electronic device, such as a cell phone or camera, in which the die 102 is installed, or of test equipment which is used during the surface mounting process, for instance.

The control circuitry 111 cooperates with the read/write circuits 165 to perform memory operations on the memory array 110. The control circuitry 110 includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than storage element array 110, can be thought of as a managing or control circuit. For example, one or more managing or control circuits may include any one of or a combination of control circuitry 110, state machine 112, decoders 114/160, power control 116, sense blocks 162, read/write circuits 165, controller 150, etc.

The controller 150 may include a storage location 152 which stores code which is executed to perform various functions. The storage location 152 may be considered to be an example of at least one processor readable storage device which has processor readable code embodied thereon for programming one or more processors, such as controller 150, to perform a computer implemented method for performing various functions. Alternatively, or additionally, the host 155 and/or control circuitry 111 may have a non-volatile storage location which stores code which is executed to perform the functions. For example, the host 155 may have a storage location 157 which stores code which is executed by a processor 158.

In another embodiment, a non-volatile memory system uses dual row/column decoders and read/write circuits. Access to the memory array 110 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 110. In this way, the density of the read/write modules is essentially reduced by one half.

In other possible embodiments, discussed further below, multiple die are arranged in a stacked manner in a common package. Typically, one controller such as controller 150 is provided for the set of die.

Figure 2:
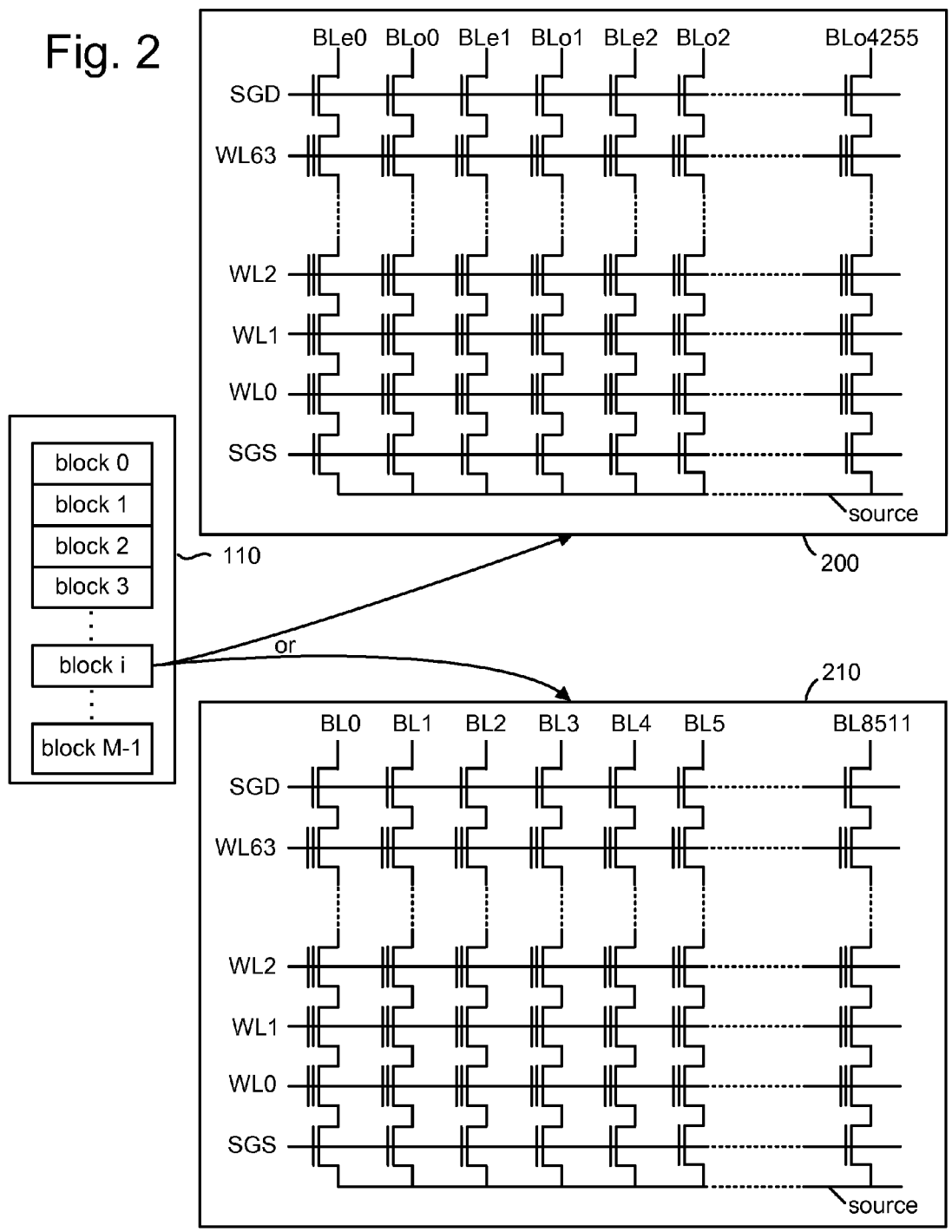
FIG. 2 illustrates an example of an organization of a memory array into blocks for an all bit line memory architecture or for an odd-even memory architecture.

FIG. 2 illustrates an example of an organization of a memory array 110 into M blocks labeled 0 to M−1 for an all bit line memory architecture or for an odd-even memory architecture. Exemplary structures of memory array 110 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, BL8511. In one embodiment referred to as an all bit line (ABL) architecture (architecture 210), all the bit lines of a block can be simultaneously selected during read and program operations. Storage elements along a common word line and connected to any bit line can be programmed at the same time.

In the example provided, storage elements are connected in series to form a NAND string. One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 200), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns, and sixty-four storage elements are shown connected in series in a column to form a NAND string.

During one configuration of read and program operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the Vth of the storage elements becomes negative.

Figure 3:
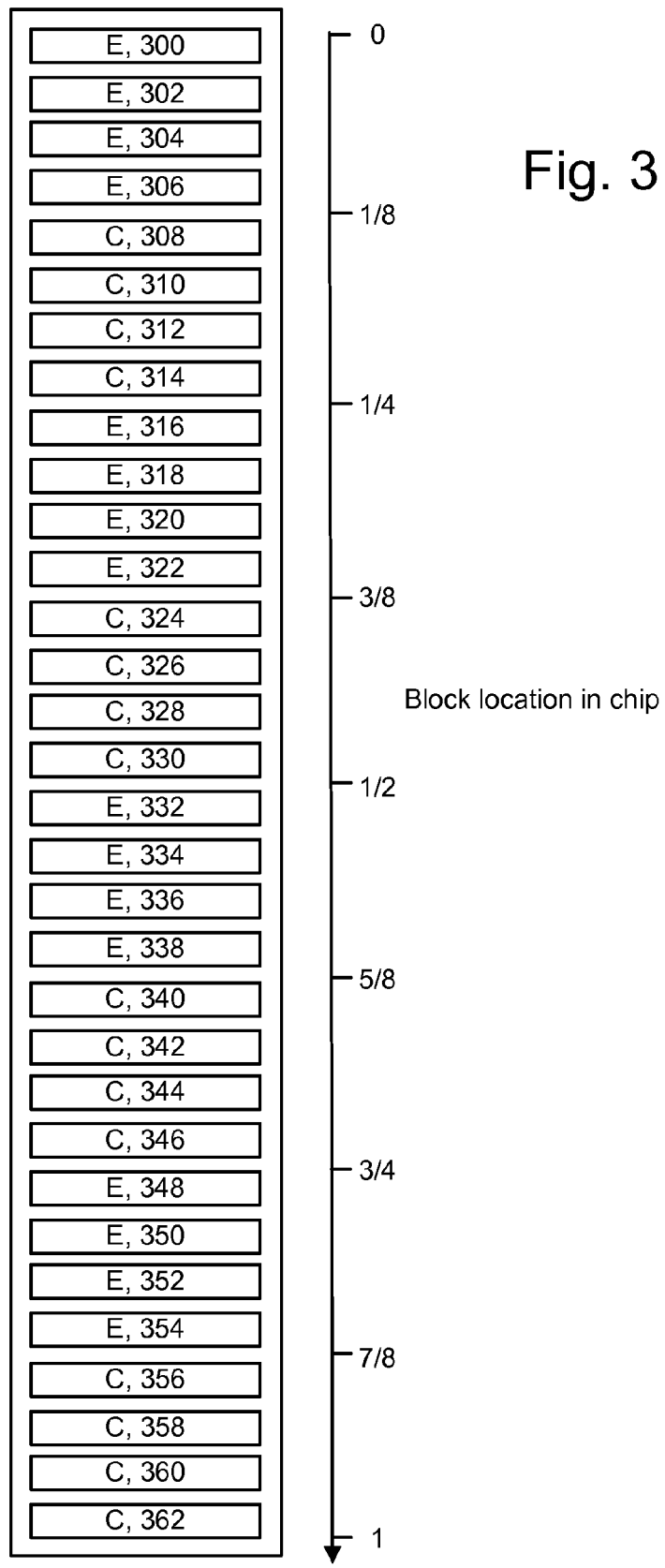
FIG. 3 depicts an arrangement of alternating sets of erased and programmed blocks in a memory chip.

FIG. 3 depicts an arrangement of alternating sets of erased and programmed blocks in a memory chip. A memory chip typically includes many blocks of storage elements arranged one after another in one or more planes. In a simplified depiction of a data pattern which was used during a test, the blocks include sets of four erased (E) blocks (3000-3006; 3016-3022; 3032-3038; 3048-3054), e.g., blocks in which all storage elements are in the erased state, interleaved with sets of four C state blocks (3008-3014; 3024-3030; 3040-3046; 3056-3062), e.g., blocks in which all storage elements are programmed to the C state. A scale extending from 0 to 1 indicates a relative distance across the blocks. Each set of blocks spans one-eighth of the total distance. In the test, some sets of blocks were programmed to the highest state, which is the C state in a four-level device, while other blocks remained in the erased state. The memory chip was then subject to a bake at 175° C. for ten hours, and the threshold voltage distributions of the different blocks were measured to obtain the following results.

FIG. 4*a* depicts a relationship of threshold voltage versus block location for the arrangement of FIG. 3, where there are significant variations in threshold voltage for the programmed blocks. Packaged NAND flash memory devices have been found to show a significant threshold voltage shift after a data retention bake, especially when a block at a high threshold voltage is located close to a cluster of erased blocks. The cause is believed to be mobile ion diffusion which is introduced during the assembly process. Mobile ions can diffuse to floating gate areas after the memory die is placed on a PCB substrate or leader frame for surface mounting, and before wire bonding. Heating steps, such as one or more solder reflow steps, are believed to introduce mobile ions which can corrupt data which has been loaded into the memory die.

This failure mode represents significant data retention issues for preloaded content, e.g., data which is loaded into the memory device prior to surface mounting. In many devices, a firmware architecture leaves all unused blocks in an erased state, which is the worst case for data retention failures during surface mounting.

As an example, for an electronic device such as a GPS device, the data which is loaded may include map data. For an automotive application, the content may be used for controlling an electronic system of a particular automobile. For a cell phone, the preloaded content could be the software image of an operating system such as MICROSOFT WINDOWS®. In practice, blocks which are preloaded with data are not usually grouped together, and, typically it is not known ahead of time which blocks will be used for the preloaded data. In particular, the memory chip manufacture typically provides a memory chip to another party which preloads data and assembles the chip into a final electronic device, such as a cell phone or camera. The chip manufacturer does not know exactly how the chip will be used.

FIG. 4a depicts threshold voltage distributions 400, 402, 404 and 406 for the C-state sets of blocks across a memory die, as depicted in FIG. 3. The threshold voltage is shifted lower most prominently for the C state blocks which are adjacent to sets of erased blocks, e.g., at the ⅛, ¼, ⅜, ½, ⅝, ¾ and ⅞ locations, as depicted by the downward sloping portions of the distributions. The level portions of the distributions represent the threshold voltage of C state blocks which are not adjacent to the sets of erased blocks. The distributions of FIG. 4a represent the behavior of a memory chip surface-mounted to a PCB substrate after a data retention bake, where the substrate is not coated with a material which reduces mobile ion diffusion.

FIG. 4b depicts a relationship of threshold voltage versus block location for the arrangement of FIG. 3, where variations in threshold voltage of the programmed blocks are reduced. The threshold voltage distributions 410, 412, 414 and 416 correspond to the distributions 400, 402, 404 and 406, respectively, of FIG. 4a. The threshold voltage is shifted lower to a lesser extent than in FIG. 4a. The distributions of FIG. 4a represent the behavior of a memory chip surface-mounted to a PCB substrate after a data retention bake, where the substrate is coated with a material which reduces mobile ion diffusion. In particular, an acrylic resin coating has been shown to be effective in tests.

Figure 5A:
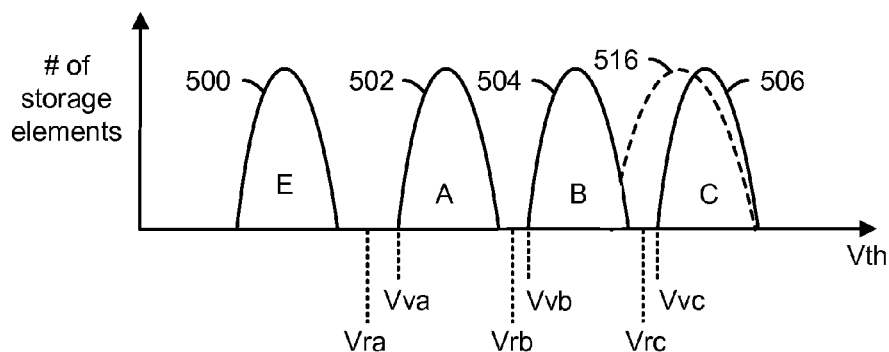
FIG. 5a depicts an example set of threshold voltage distributions for a set of four-state blocks of storage elements, showing widened distributions for the highest state.

FIG. 5a depicts an example set of threshold voltage distributions for a set of four-state blocks of storage elements, showing widened distributions for the highest state. The x-axis denotes threshold voltage and the y-axis denotes a number of storage elements. A four-state or four-level memory device may store two bits of data per state in four data states referred to as an erased or E state, represented by distribution 500, and programmed states A, B and C, represented by distributions 502, 504 and 506, respectively. It has been found that data retention of higher data states, such as the C state, which is the highest programmed state in a four-state device, is sensitive to the data pattern inside a memory device during the high temperatures seen during the surface mount process. For example, the C state distribution 506 can transition to a representative widened distribution 516 which falls below the read reference voltage Vrc, thereby corrupting some of the C state data, based on the data states of surrounding blocks. In practice, different degrees of shifting are seen for different programmed blocks.

The distribution 506 is consistent with FIG. 4b, while the distribution 516 is consistent with FIG. 4a.

Regarding the mechanism for Vth shifting, it is believed that groups of erased blocks create a channel which allows charges to move and affect user data. The programmed storage elements have highly positive states which can attract mobile electrons that move in the circuitry. The high temperatures of a surface mounting process cause the electrons to be channeled by these groups of erased blocks so that they affect the user data. User data near erased blocks is most affected.

Generally, a worst case shift in Vth occurs for one or more programmed blocks surrounded by a number of erased blocks. Typically, the presence of more than four erased blocks together can affect user data. The worst case is to have one programmed block surrounded by erased blocks on both sides in the same plane. A plane refers to a well in a memory chip. In some cases, more than one plane is used in a chip. Moreover, the problem will be worse for smaller, more scaled, devices since the blocks will be closer together.

FIG. 5a also depicts three read reference voltages, Vra, Vrb and Vrc, which are used for reading data from storage elements. By testing whether the threshold voltage of a given storage element is above or below each read level, the system can determine the state, e.g., programming condition, the storage element is in. Three verify reference voltages, Vva, Vvb and Vvc, are also provided. When programming storage elements to state A, B or C, the system will test whether those storage elements have a threshold voltage greater than or equal to Vva, Vvb or Vvc, respectively.

The problem of altered Vth distributions can occur in a single die package or on multiple stacked dice packages. In particular, the threshold voltage (Vth) distribution shift of a block is strongly dependent on the data state of multiple neighboring blocks. Blocks near multiple erased blocks showed a higher Vth distribution shift. Shifting of the threshold voltage distribution of the A and B state storage elements was relatively minor compared to the shifting of the C state.

Figure 5B:
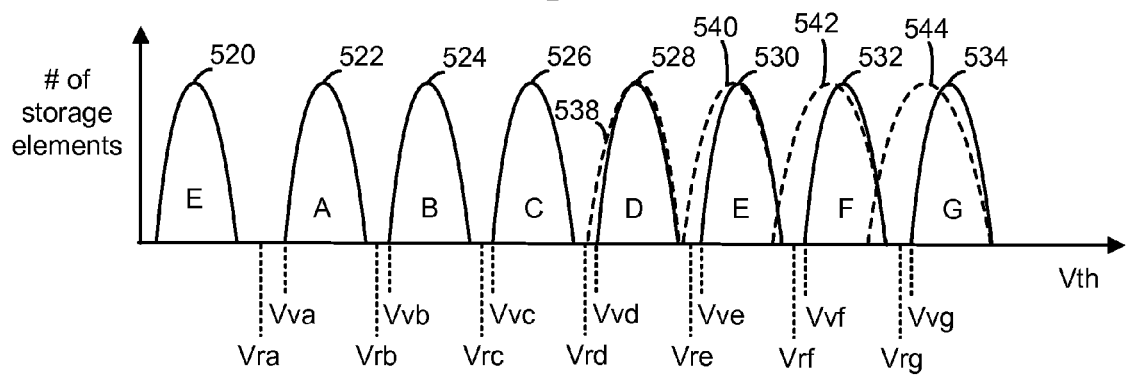
FIG. 5b depicts an example set of threshold voltage distributions for a set of eight-state blocks of storage elements, showing widened distributions for the highest states.

FIG. 5b depicts an example set of threshold voltage distributions for a set of eight-state blocks of storage elements, showing widened distributions for the highest states. An eight-state or eight-level memory device may store three bits of data per state in eight data states referred to as an erased or E state, represented by distribution 520, and programmed states A, B, C, D, E, F and G, represented by distributions 522, 524, 526, 528, 530, 532 and 534, respectively. It is believed that data retention of higher data states, such as the D-G states, is most affected by mobile ion diffusion. For example, the D, E, F and G state distributions 528, 530, 532 and 534, respectively, can transition to representative widened distribution 538, 540, 542 and 544, respectively. In some case, corrupted data results. Shifting of the lower states is generally not significant. Here, worst case results are expected due to the surrounding of the programmed blocks by erased blocks. Note that a similar problem is expected with storage elements which store more than eight states of data.

The distributions 528, 530, 532 and 534 are consistent with the FIG. 4b, while the distributions 538, 540, 542 and 544 are consistent with FIG. 4a.

FIG. 5b also depicts seven read reference voltages, Vra, Vrb, Vrc, Vrd, Vre, Vrf and Vrg, which are used for reading data from storage elements. By testing whether the threshold voltage of a given storage element is above or below each read level, the system can determine the state, e.g., programming condition, the storage element is in. Seven verify reference voltages, Vva, Vvb, Vvc, Vvd, Vve, Vvf and Vvg are also provided. When programming storage elements to state A, B, C, D, E, F or G, the system will test whether those storage elements have a threshold voltage greater than or equal to Vva, Vvb, Vvc, Vvd, Vve, Vvf and Vvg, respectively.

Figure 6A:
FIGS. 6a-6i depict fabrication of a non-volatile memory apparatus with a coating which reduces mobile ion diffusion.

FIGS. 6a-6h depict fabrication of a non-volatile memory apparatus with a coating which reduces mobile ion diffusion. FIG. 6a depicts an insulating material 600 of a PCB substrate. The insulating material 600 may include multiple dielectric layers which are laminated together by epoxy resin. A conductive layer 602 such as a thin copper foil layer is laminated onto the substrate 600. The conductive layer 602 is patterned such as by etching to form a desired pattern of conductive traces of a circuit. Typically, a subtractive technique is used in which unwanted copper is removed. Example techniques include silk screen printing, which uses etch-resistant inks to protect the copper foil, while subsequent etching removes the unwanted copper. Photoengraving uses a photomask and chemical etching to remove the copper foil from the substrate. PCB milling uses a two or three-axis mechanical milling system to mill away the copper foil from the substrate.

Figure 6B:
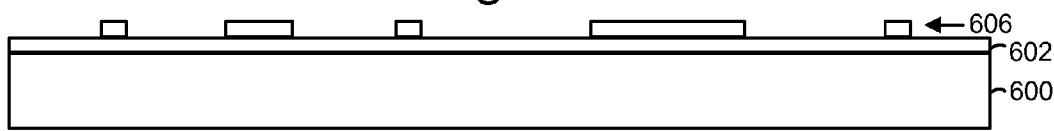
Figure 6C:
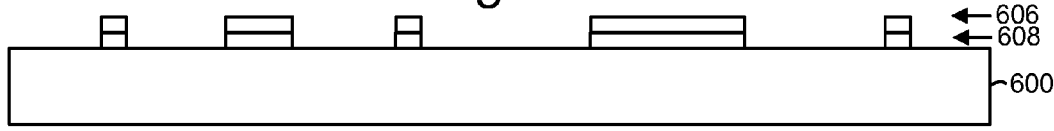
Figure 6D:
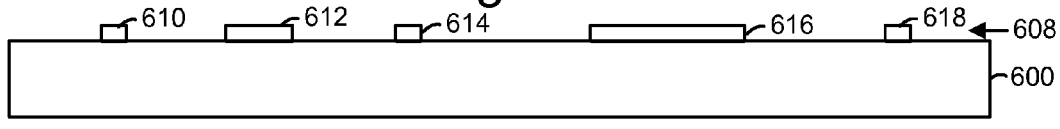

As an example of photoengraving, a photoresist layer 604 is applied over the copper layer 602. A pattern of a photomask can be transferred to the photoresist layer 604 by selectively exposing the photoresist layer to UV light and removing the exposed portion of the photoresist using a developer, in one possible approach. The resulting patterned photoresist layer 606 is shown at FIG. 6b. An etching process is then performed to transfer the pattern of the patterned photoresist layer 606 to the copper layer, as shown at FIG. 6c, resulting in a patterned copper layer 608 with conductive portions or traces. The remaining photoresist portions are then removed, resulting in the structure of FIG. 6d. The conductive portions or traces 610, 612, 614, 616 and 618 are depicted as example traces along the cross sectional view of FIG. 6d. A solder mask layer 620 is then applied over the conductive traces. Solder mask, or solder resist, is a lacquer like layer of polymer that provides a permanent protective coating for the copper traces of the PCB and prevents solder from bridging between conductors, thereby preventing short circuits. Various other steps, such as formation of vias, are not depicted.

Figure 6E:
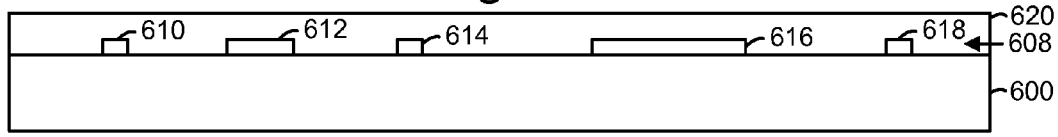
Figure 6F:
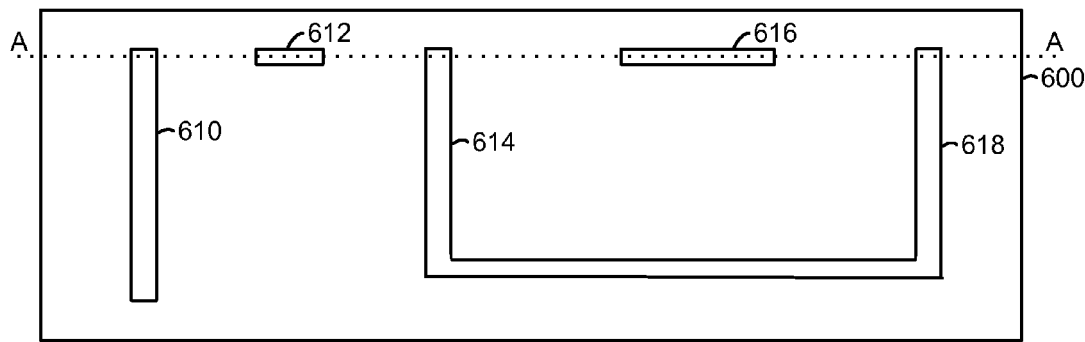

FIG. 6f depicts a top view of the structure of FIG. 6e. FIG. 6e depicts a cross-sectional view of the structure of FIG. 6f along line A-A. As a simplified example, the conductive traces can extend in various patterns across a plane of the PCB.

Figure 6G:
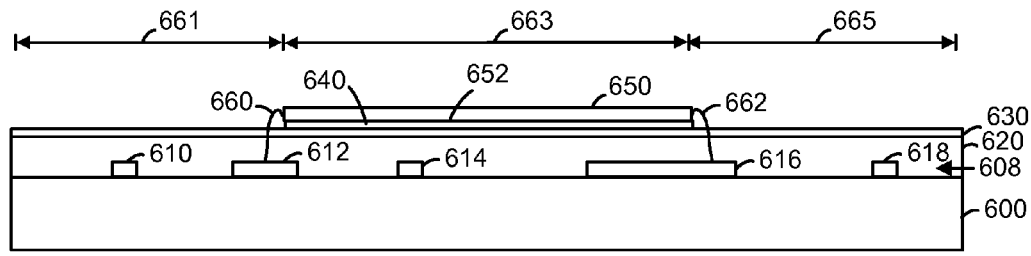
Figure 6H:
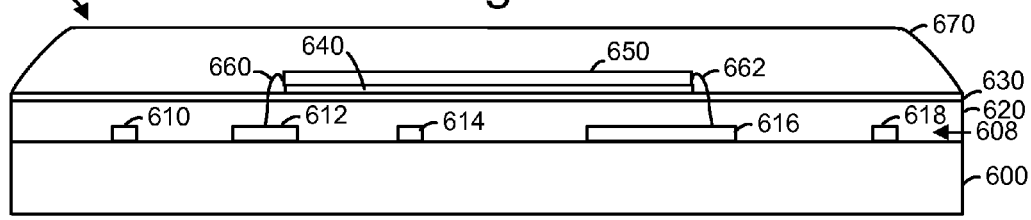

In FIG. 6g, a coating 630 which acts as a barrier to mobile ions is applied to the PCB, such as directly on and in contact with the solder mask layer 620, to reduce mobile ion diffusion. A memory chip 650 is surface mounted to the PCB using an adhesive film layer 640, and wire bonded to the traces, e.g., 612 and 616, via wires 660 and 662, respectively. An encapsulant 670 or molding compound such as plastic is then applied as depicted in FIG. 6h to form the memory device package 690. The adhesive layer 640 can be between, and in contact with, the non-volatile memory chip 650 and the coating 630 of the printed circuit board. The non-volatile memory chip 650 is attached to the printed circuit board substrate by the adhesive layer. In particular, the non-volatile memory chip can have a thinned and polished backside 652 which is contacted by the adhesive layer 640. The encapsulant 670 is provided over the coating 630 and over the non-volatile memory chip 650. The encapsulant contacts a portion of the coating 630 which is not covered by the non-volatile memory chip 650, e.g., the area of the coating which is lateral of the chip 650, as well as contacting the backside 652 of the non-volatile memory chip.

Regarding the coating 630, it has been found that an acrylic resin coating is effective. The thickness of the coating can be about 10 μm. This thickness has been found to be effective. Reduced thickness can be used as well. A thickness in the range of 5-15 μm may be used. While greater thicknesses can be used as well, e.g., over 10 problems can occur if the coating is too thick. For example, maintaining a uniform thickness becomes more difficult for a thicker coating. A non-uniform thickness can cause local stresses in the memory chip which is attached to the coating layer 630.

One example of a suitable acrylic resin coating is KONFORM® AR, manufactured by ITW Chemtronics, Kennesaw, Ga., United States. This product is an acrylic conformal coating which provides a hard, durable protective barrier, and meets MIL-I-46058C, Type AR specification. It is a clear transparent coating. Conformal coatings can be used for providing a coating over a PCB after chips and ICs have been surface mounted. The importance of providing the coating between the chip and the substrate has not been previously identified. The composition of KONFORM® AR is as follows:

| Ingredient: | Weight range, % |
| --- | --- |
| n-Butyl acetate | 10-20 |
| n-propyl acetate | 10-20 |
| Propylene glycol monomethyl ether acetate | 10-20 |
| Ethanol | 10-20 |
| Propane/isobutane blend | 20-30 |
| Methyl ethyl ketone | 2-5 |
| Acrylic copolymer resin | 5-15 |

Another possibility for the coating 630 is KONFORM® SR, also manufactured by ITW Chemtronics. It is a high-viscosity, flexible silicone coating for applications which require a thicker coating than an acrylic resin coating. Other types of polymer coatings can be used as well. Any coating which can trap metal contamination can be used. The ability of a material to trap metal contamination can be determined by its diffusivity to a metal such as copper. The diffusivity of polymer is relatively high so that a small amount of the coating will prevent mobile ion diffusion. The coating should have a good solubility so that it can be applied in a single layer on top of the solder mask, and it should have a sufficient viscosity or flow on the PCB board.

Before applying the coating 630, the circuit board is cleaned to remove contamination and allow to dry. The coating can be applied in various ways, such as by a spray application, dip application, or brush application. A spray application has been found to provide good results, as it provides a uniform coating. Only minor modifications to existing assembly process flows are needed. Uniformity of the coating thickness within a micron range is desired. The coating 630 can extend over the entire PCB including a portion which is under the die 650. The coating can extend across an entire face of the printed circuit board to which the non-volatile memory chip is attached. The coating can have a uniform thickness across the entire face of the printed circuit board, such as a thickness of 10 with a uniformity of about +/−1 or +/−10% of the average thickness of the coating. In an area 663 of the substrate, the coating can extend between, and be in contact with, the non-volatile memory chip on one side of the coating, and with the solder mask layer of the PCB substrate on the other side of the coating. The coating 630 should extend laterally of the die as well, in areas 661 and 665 of the substrate, and can cover the entire metal trace to avoid side diffusion of mobile ions to the memory chip 650 via the encapsulant.

Note that the memory chip 650 in this example is attached directly to the PCB in a direct chip attachment or chip-on-board configuration. Mobile ion diffusion is believed to be problematic in this configuration, and the solutions provided herein are particularly suitable for this configuration. In this semiconductor assembly technology, the microchip or die is directly mounted on, and electrically interconnected to, its final circuit board, instead of undergoing traditional assembly or packaging as an individual integrated circuit (IC). The elimination of conventional device packaging simplifies the design and manufacturing process, while improving performance due to shorter interconnection paths.

The chip-on-board process includes three major steps: 1) die attach or die mount; 2) wire bonding; and 3) encapsulation of the die and wires. A type of chip-on-board assembly is the flip-chip on board, which does not require wirebonding since it employs a chip whose bond pads are bumped, and can connect directly to designated pads on the board. The chip faces downward on the board. In addition to encapsulation, the flip chip is underfilled to protect its active surface and bumps from thermo-mechanical and chemical damage. The underfilling involves applying a protective material in an area which is directly underneath the chip.

The die attach process can involve applying a die attach adhesive 640 to the board or substrate and mounting the chip or die 650 over this die attach material. The adhesive can be applied by dispensing, stencil printing, or pin transfer. Die placement should be accurate enough to ensure proper orientation and good planarity of the die. This is followed by a curing process, such as by exposure to heat or ultraviolet light, which allows the adhesive to attain its final mechanical, thermal, and electrical properties. After curing, organic contaminants are removed either by plasma or solvent cleaning so as not to affect the wire bonding process.

The wire bonding process is similar to that used in traditional semiconductor assembly. Thermosonic gold or copper ball bonding or ultrasonic aluminum wedge bonding may be employed to connect wires 660 and 662 between the die 650 and the conductive traces 612 and 616. Chip-to-chip wire bonding may also be performed for multi-chip assemblies.

Finally, the die and bond wires are encapsulated to protect them from mechanical and chemical damage. Encapsulation can involve dispensing a liquid encapsulant material, which is usually epoxy-based, over the die and wires, or by transfer molding. The encapsulant also undergoes curing.

Figure 6I:
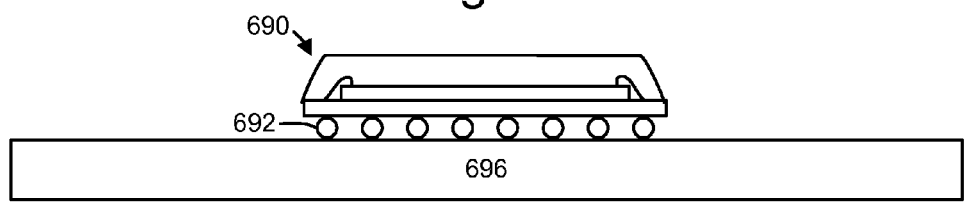

As depicted in FIG. 6i, the memory device package 690 can be mounted to another PCB substrate 696 using solder balls 692, for instance. For example, an electronic device manufacturer, such as a cell phone or digital camera manufacturer, can use the uses the memory device package 690 by surface mounting it to a substrate such as a printed circuit board (PCB) or a leader frame.

The surface mounting process typically involves heating the PCB 696 with the memory device package 690 positioned on it, in a solder reflow process. For example, a ball grid array technique may be used in which the chip package has one face with solder balls in a grid pattern. These balls are used to conduct electrical signals from the integrated circuit to the PCB on which it is placed. The PCB carries copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies.

Another possible approach involves applying solder paste to specific locations on the PCB, positioning the chip on the solder paste deposits which will hold them in place on the board, and performing a solder reflow, which is a high-temperature process that melts the solder paste so that it can form the final solder connection between the chip and the PCB.

A solder reflow process uses a solder reflow oven, which exposes the board assembly to the necessary temperature profile by heating an environment into which the board assembly, including the chip package, is placed. Moreover, more than one reflow process can be performed. For example, device manufactures often have double-sided boards, in which case they will position components on one side of the board, perform a reflow to mount those components, flip the board over to position components on the opposite side of the board, and perform another reflow process to mount those components.

The memory device package 690 could alternatively be mounted to a leader frame, discussed further below. A leader frame, usually made of copper, can be used to connect an integrated circuit chip to outside circuitry. Typically, the chip is attached to a bonding pad of a leader frame. Once the chip is attached, wires are bonded to input/output pads of the integrated circuit and to internal leads of the lead frame. This arrangement of a chip, a leader frame, and bonding wires is then encapsulated in a plastic casing leaving external leads of the leader frame exposed (outside of the plastic casing). The packaged integrated circuit can then be connected to other electronic components on a conventional circuit board by its external leads.

Figure 7:
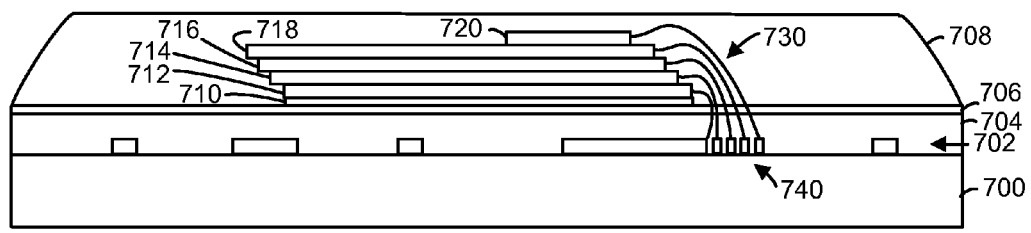
FIG. 7 depicts a multi-chip non-volatile memory apparatus with a coating which reduces mobile ion diffusion.

FIG. 7 depicts a multi-chip non-volatile memory apparatus with a coating which reduces mobile ion diffusion. The apparatus includes an insulating PCB substrate 700, conductive traces 702, including traces 740, a solder mask layer 704, a coating 706 which acts as a barrier to mobile ions, an adhesive layer 710 and a memory die 712 which is attached to the adhesive layer. Moreover, die 714 is attached to die 712, die 716 is attached to die 714 and die 718 is attached to die 716. A controller chip 720 may be provided to control input and output of the die 712-718. Wire bonding wires 730 are provided, along with an encapsulation material 708.

A stacked die configuration presents challenges such as the need to keep the stack thermally and mechanically stable, while keeping the resulting package as thin as possible. To this end, wafer thinning is commonly used. Wafer thinning involves wafer back grinding followed by a polishing step that relieves stresses imparted by the back grind process to the wafer. Wafers intended for die stacking can be thinned to about 3-6 mils, for instance depending on the use and the wafer size. This technique can also be used for single die packages as well. It is believed that after wafer back grinding is performed, gettering sites are created that can trap charges. However, after polishing, when the bottom of the chip is very smooth, the gettering sites are removed so that charges can move more easily into the floating gates of the non-volatile storage elements of the chip, contributing to mobile ion diffusion and Vth shifts as discussed. Wafer thinning can also be used for a single die configuration.

The above configurations and mounting schemes are examples only, as variations are possible.

Figure 8:
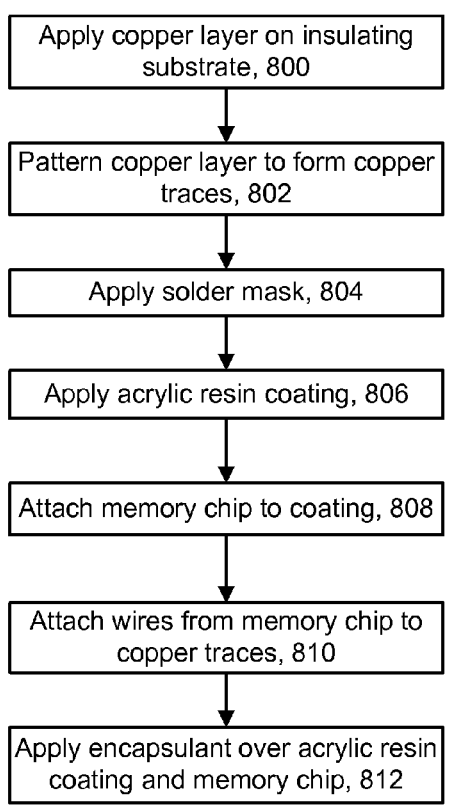
FIG. 8 depicts a method for fabricating a non-volatile memory apparatus with a coating which reduces mobile ion diffusion.

FIG. 8 depicts a method for fabricating a non-volatile memory apparatus with a coating which reduces mobile ion diffusion. Step 800 involves applying a copper layer, or a layer of other conductive material, on an insulating substrate (see FIG. 6*a*). Step 802 involves patterning the copper layer to form copper traces (see FIG. 6*d*). Step 804 involves applying a solder mask (see FIG. 6*e*). Step 806 involves applying an acrylic resin coating (see FIG. 6*g*). Step 808 involves attaching a memory chip to the coating (see FIG. 6*g*). Step 810 involves attaching wires from the memory chip to the copper traces (see FIG. 6*g*). Step 812 involves applying an encapsulant over the acrylic resin coating and the memory chip (see FIG. 6*h*).

Figure 9:
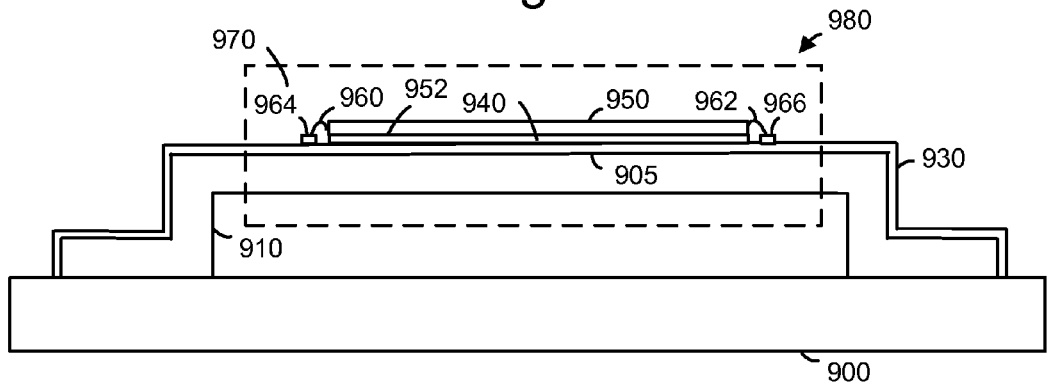
FIG. 9 depicts a non-volatile memory apparatus attached to a leader frame which has a coating which reduces mobile ion diffusion.

FIG. 9 depicts a non-volatile memory apparatus attached to a leader frame which has a coating which reduces mobile ion diffusion. Some integrated circuit designs use a leader frame 910 to mount one or more memory chips. The leader frame, which comprises a conductive material such as copper, is attached to a PCB 900 or other substrate. In such cases, mobile ion diffusion from the leader frame to the memory chip can occur. To reduce or prevent shifts in the threshold voltages of the storage elements in the memory chip, a coating as discussed previously can be applied to the leader frame. In a simplified example, a non-volatile memory package 980 is attached to a leader frame 910 on which a coating 930 is applied. The leader frame 910 extends through the non-volatile memory package 980. The coating can be applied on the top of the leader frame, or all around the leader frame, totally enveloping the leader frame. The coating should be applied on a face 905 of the leader frame on which the memory chip is attached, between the face and the memory chip, and to locations on the side of the leader frame which are lateral of the memory chip.

The coating 930 extends under an adhesive film 940 which is used to attach a memory chip 950 to the leader frame. Wires 960 and 962 extend between the memory chip 950 and example bonding pads 964 and 966, respectively, of the leader frame. An encapsulant 970 surrounds the memory chip 950 and a portion of the leader frame 910. Thus, the non-volatile memory chip 950 is attached to the leader frame over the coating 930, in a direct chip attachment or chip-on-board configuration, such that the coating extends between the non-volatile memory chip and the leader frame. The adhesive layer 940 is between, and in contact with, the non-volatile memory chip 950 and the coating 930. The non-volatile memory chip is attached to the leader frame by the adhesive layer, and the non-volatile memory chip has a thinned and polished backside 952 which is contacted by the adhesive layer 940.

In this example, one memory chip is provided on top of the leader frame. In other possible configurations, multiple memory chips are stacked on one or both sides of the leader frame. See U.S. patent publication 2004/0251557, incorporated herein by reference, for further information regarding a configuration in which multiple memory chips are stacked on both sides of a leader frame.

Figure 10:
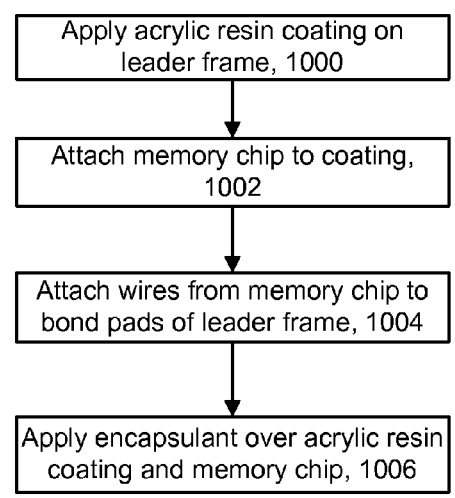
FIG. 10 depicts a method for fabricating a non-volatile memory apparatus on a leader frame using a coating which reduces mobile ion diffusion.

FIG. 10 depicts a method for fabricating a non-volatile memory apparatus on a leader frame using a coating which reduces mobile ion diffusion. Step 1000 involves applying an acrylic resin coating on the leader frame. Step 1002 involves attaching a memory chip to the coating. Step 1004 involves attaching wires from the memory chip to bond pads of the leader frame. Step 1006 involves applying an encapsulant over the acrylic resin coating and the memory chip.

Figure 11A:
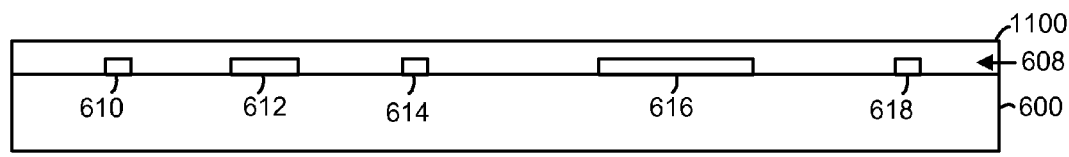
FIGS. 11a-11g depict fabrication of a non-volatile memory apparatus with a patterned barrier material which reduces mobile ion diffusion.
Figure 11B:
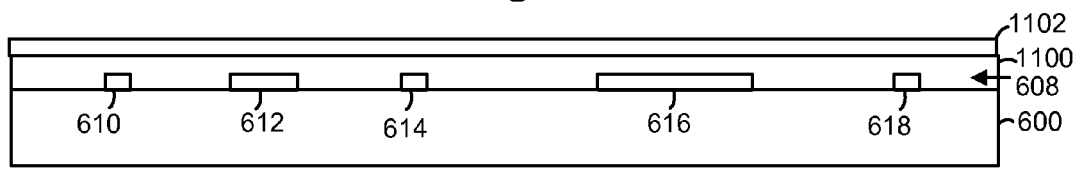
Figure 11C:
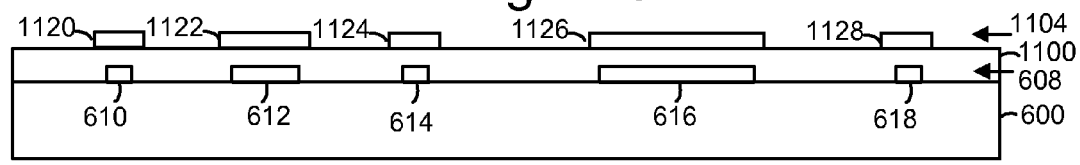
Figure 11D:
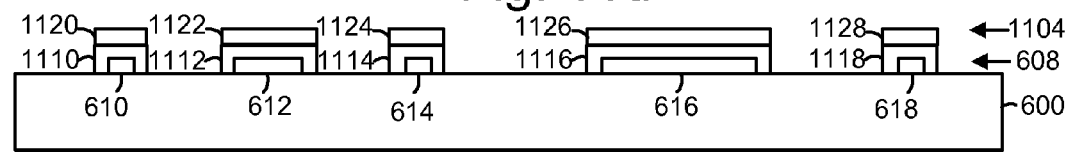

FIGS. 11*a*-11*g* depict fabrication of a non-volatile memory apparatus with a patterned barrier material which reduces mobile ion diffusion. In this approach, the fabrication process depicted in FIGS. 6*a*-6*d* can be followed to provide an insulating PCB substrate 600 and conductive traces 608, such as traces 610, 612, 614, 616 and 618. A conductive barrier material layer 1100 is then applied over, around, and in contact with, the conductive traces. The barrier material may include one or more of Tantalum (Ta), Tantalum Nitride (TaN) and Titanium Nitride (TiNi). The barrier layer 1100 can be patterned in a similar manner as the copper traces were patterned, such as by applying a photoresist layer 1102 (FIG. 11*b*), transferring a pattern to the photoresist layer to form photoresist portions 1104 (FIG. 11*c*), such as portions 1120, 1122, 1124, 1126 and 1128, and using the photoresist portions to selectively etch the barrier material 1100. As a result, a pattern is transferred to the barrier material to form barrier material portions 1110, 1112, 1114, 1116 and 1118 which surround respective copper trace portions 610, 612, 614, 616 and 618, respectively (FIG. 11*d*). The remaining photoresist portions are then removed to arrive at the structure of FIG. 11*e*.

The barrier material portions generally surround, envelop and seal respective conductive trace portions to prevent or reduce ion diffusion from the conductive trace portions and resulting threshold voltage shifts in the memory chip. Each barrier trace at least partially envelopes a corresponding copper trace to reduce out diffusion of mobile ions from the corresponding copper trace toward the non-volatile memory chip. The metal barrier traces are fabricated in the same pattern as the copper traces but are wider than the associated copper traces so that they at least partially envelop and surround the copper traces. This is achieved by having the photoresist portions 1120, 1122, 1124, 1126 and 1128 wider than the associated copper traces. For example, the copper trace 618 has a top surface 619 and opposing side walls or surfaces 621 and 623, which are sealed in, and contacted by, the barrier trace 1118 (FIG. 11*e*), to reduce out diffusion from the copper trace 618. The barrier material portions are traces which are separated from one another to prevent shorting of the associated copper traces.

Figure 11E:
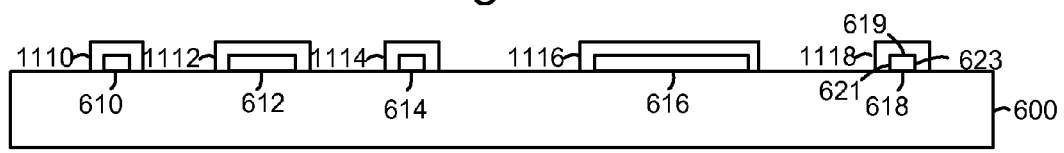
Figure 11F:
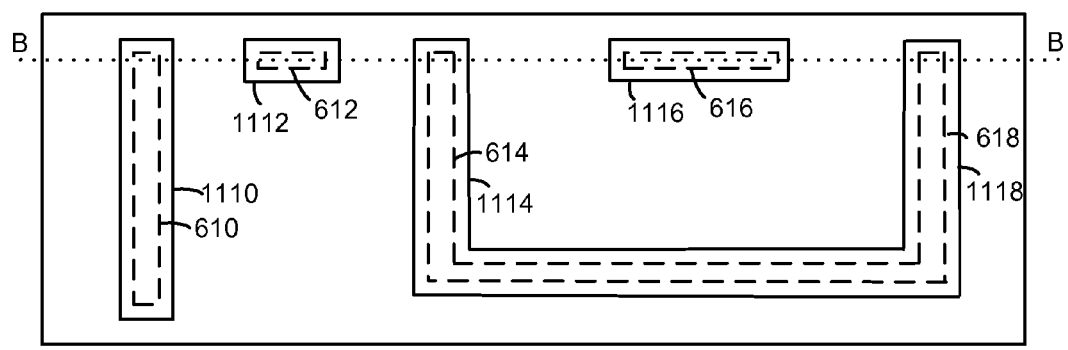

FIG. 11*f* depicts a top view of the structure of FIG. 11*e*. FIG. 11*e* depicts a cross-sectional view of the structure of FIG. 11*f* along line B-B. As a simplified example, the conductive traces can extend in various patterns across a plane of the PCB. Here, the example copper traces 610, 612, 614, 616 and 618 can be seen along with the corresponding barrier material traces 1110, 1112, 1114, 1116 and 1118, respectively.

Figure 11G:
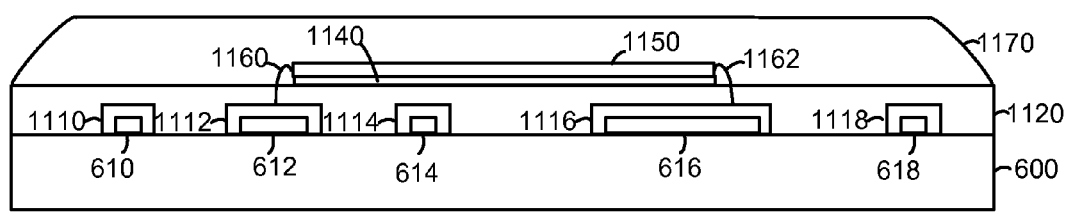

In FIG. 11*g*, a solder mask layer 1120 is applied over the barrier material and the copper traces, and a memory chip 1150 is surface mounted to the PCB using an adhesive film layer 1140. The memory chip 1150 is wire bonded to the barrier material traces, e.g., 1112 and 1116, or to the copper traces, e.g., 612 and 616, via wires 1160 and 1162, respectively. Each barrier trace is in electrical communication with its respective copper circuit trace, so a wire which is in electrical communication with a barrier trace is also in electrical communication with the respective copper circuit trace. An encapsulant 1170 or molding compound such as plastic is then applied. A multi-chip embodiment, similar to the embodiment of FIG. 7, can also be provided.

It is also possible to combine the use of barrier material with a coating such as the coating 630 which was discussed previously.

Figure 12:
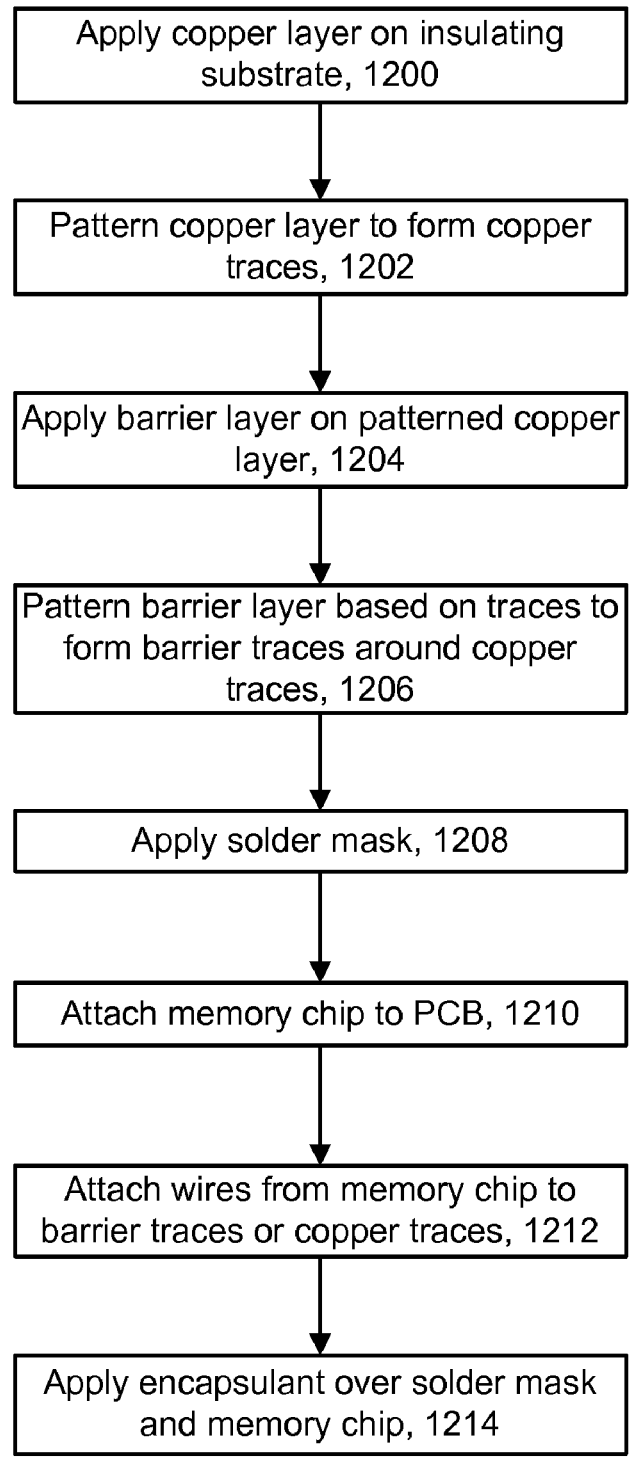
FIG. 12 depicts a method for fabricating a non-volatile memory apparatus with a patterned barrier material which reduces mobile ion diffusion.

FIG. 12 depicts a method for fabricating a non-volatile memory apparatus with a patterned barrier material which reduces mobile ion diffusion. Step 1200 involves applying a copper layer, or a layer of other conductive material, on an insulating substrate (see FIG. 6*a*). Step 1202 involves patterning the copper layer to form copper traces (see FIG. 6*d*). Step 1204 involves applying a barrier layer on the patterned copper layer (see FIG. 11a). Step 1206 involves patterning the barrier layer based on the copper traces to form barrier traces around the copper traces (see FIG. 11d). Step 1208 involves applying a solder mask (see FIG. 11g). Step 1212 involves attaching a memory chip to the PCB (see FIG. 11g). Step 1212 involves attaching wires from the memory chip to the barrier traces or copper traces (see FIG. 11g). Step 1214 involves applying an encapsulant over the PCB and the memory chip (see FIG. 11g).

In one embodiment of the technology described herein, a non-volatile memory apparatus includes a printed circuit board substrate. The printed circuit board substrate includes an insulating layer, a solder mask layer, including copper traces, on the insulating layer, and an acrylic resin coating on the solder mask layer. The non-volatile memory apparatus further includes a non-volatile memory chip attached to the printed circuit board substrate, in a direct chip attachment configuration, such that the acrylic resin coating extends between the non-volatile memory chip and the printed circuit board substrate.

In another embodiment, a non-volatile memory apparatus includes a non-volatile memory package which includes a non-volatile memory chip, a leader frame which extends through the non-volatile memory package, where the leader frame comprises a conductive material, and an acrylic resin coating on a face of the leader frame. The non-volatile memory chip is attached to the leader frame over the acrylic resin coating, in a direct chip attachment configuration, such that the acrylic resin coating extends between the non-volatile memory chip and the leader frame.

In another embodiment, a non-volatile memory apparatus includes a printed circuit board substrate, where the printed circuit board substrate comprises an insulating layer, a pattern of copper traces on the insulating layer, a pattern of barrier traces on, and corresponding to, the pattern of copper traces, and a solder mask layer on the insulating layer, where the pattern of copper traces and the pattern of barrier layer traces are in the solder mask layer. The non-volatile memory apparatus further includes a non-volatile memory chip attached to the printed circuit board substrate, above the solder mask layer, in a chip-on-board configuration.

In another embodiment, a method for fabricating a non-volatile memory apparatus includes forming a copper layer on an insulating layer, etching the copper layer to form a pattern of copper traces on the insulating layer, forming a barrier layer on the pattern of copper traces, etching the barrier layer to form a pattern of barrier traces on, and corresponding to, the pattern of copper traces, forming a solder mask layer on the insulating layer, so that the pattern of copper traces and the pattern of barrier layer traces are in the solder mask layer, and attaching a non-volatile memory chip above the solder mask layer, in a chip-on-board configuration.

Corresponding apparatuses and methods for fabricating the apparatus are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A non-volatile memory apparatus, comprising:
   a printed circuit board substrate, the printed circuit board substrate includes an insulating layer, a solder mask layer, including copper traces, on the insulating layer, and an acrylic resin coating on the solder mask layer; and
   a non-volatile memory chip attached to the printed circuit board substrate, in a direct chip attachment configuration, such that the acrylic resin coating extends between the non-volatile memory chip and the printed circuit board substrate.

2. The non-volatile memory apparatus of claim 1, further comprising:
   wires bonded to the non-volatile memory chip, the wires extend through the acrylic resin coating, between the non-volatile memory chip and the copper traces.

3. The non-volatile memory apparatus of claim 1, wherein:
   the acrylic resin coating extends across an entire face of the printed circuit board to which the non-volatile memory chip is attached.

4. The non-volatile memory apparatus of claim 3, wherein:
   the acrylic resin coating has a uniform thickness across the entire face of the printed circuit board of about 10 μm.

5. The non-volatile memory apparatus of claim 1, further comprising:
   an encapsulant over the acrylic resin coating and the non-volatile memory chip, the encapsulant contacts a portion of the acrylic resin coating which is not covered by the non-volatile memory chip, and contacts the non-volatile memory chip.

6. The non-volatile memory apparatus of claim 1, further comprising:
   an adhesive layer between, and in contact with, the non-volatile memory chip and the printed circuit board, the non-volatile memory chip is attached to the printed circuit board substrate by the adhesive layer, and the non-volatile memory chip has a thinned and polished backside which is contacted by the adhesive layer.

7. A method of fabricating the non-volatile memory apparatus of claim 1.

8. A non-volatile memory apparatus, comprising:
   a non-volatile memory package which includes a non-volatile memory chip;
   a leader frame which extends through the non-volatile memory package, the leader frame comprises a conductive material; and
   an acrylic resin coating on a face of the leader frame, the non-volatile memory chip is attached to the leader frame over the acrylic resin coating, in a direct chip attachment configuration, such that the acrylic resin coating extends between the non-volatile memory chip and the leader frame.

9. The non-volatile memory apparatus of claim 8, further comprising:
   an adhesive layer between, and in contact with, the non-volatile memory chip and the acrylic resin coating, the non-volatile memory chip is attached to the leader frame by the adhesive layer, and the non-volatile memory chip has a thinned and polished backside which is contacted by the adhesive layer.

10. A method of fabricating the non-volatile memory apparatus of claim 8.

11. A non-volatile memory apparatus, comprising:
    a printed circuit board substrate, the printed circuit board substrate comprises an insulating layer, a pattern of copper traces on the insulating layer, a pattern of barrier traces on, and corresponding to, the pattern of copper traces, and a solder mask layer on the insulating layer, the pattern of copper traces and the pattern of barrier layer traces are in the solder mask layer; and a non-volatile memory chip attached to the printed circuit board substrate, above the solder mask layer, in a chip-on-board configuration.

12. The non-volatile memory apparatus of claim 11, comprising:

each copper trace includes a top portion and two opposing side portions; and each barrier trace contacts the top portion and the two opposing side portions of a corresponding copper trace.

13. The non-volatile memory apparatus of claim 11, wherein:

each barrier trace at least partially envelopes a corresponding copper trace.

14. The non-volatile memory apparatus of claim 11, wherein:

the barrier traces comprise a conductive material.

15. The non-volatile memory apparatus of claim 11, wherein:

the barrier traces comprise at least one of Tantalum, Tantalum Nitride and Titanium Nitride.

16. A method of fabricating the non-volatile memory apparatus of claim 11.

17. A method for fabricating a non-volatile memory apparatus, comprising:

forming a copper layer on an insulating layer;

etching the copper layer to form a pattern of copper traces on the insulating layer;

forming a barrier layer on the pattern of copper traces;

etching the barrier layer to form a pattern of barrier traces on, and corresponding to, the pattern of copper traces;

forming a solder mask layer on the insulating layer, so that the pattern of copper traces and the pattern of barrier layer traces are in the solder mask layer; and attaching a non-volatile memory chip above the solder mask layer, in a chip-on-board configuration.

18. The method of claim 17, wherein:

each copper trace includes a top portion and two opposing side portions; and each barrier trace contacts the top portion and the two opposing side portions of a corresponding copper trace.

19. The method of claim 17, wherein:

each barrier trace at least partially envelopes a corresponding copper trace.

20. The method of claim 17, wherein:

the barrier traces comprise a conductive material.

21. The method of claim 17, wherein:

the barrier traces comprise at least one of Tantalum, Tantalum Nitride and Titanium Nitride.

22. A non-volatile memory apparatus fabricated by the method of claim 17.

\* \* \* \* \*